(12) United States Patent
Afghahi

(10) Patent No.: US 6,566,968 B2
(45) Date of Patent: May 20, 2003

(54) OSCILLATOR HAVING MULTI-PHASE COMPLEMENTARY OUTPUTS

(75) Inventor: Morteza Cyrus Afghahi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/735,327

(22) Filed: Dec. 12, 2000

(65) Prior Publication Data

US 2001/0030582 A1 Oct. 18, 2001

Related U.S. Application Data

(60) Provisional application No. 60/170,590, filed on Dec. 13, 1999.

(51) Int. Cl.⁷ .................................................. H03B 5/24
(52) U.S. Cl. ............................. 331/45; 331/57; 331/175
(58) Field of Search ............................. 331/45, 57, 175

(56) References Cited

U.S. PATENT DOCUMENTS

| | | | | |
|---|---|---|---|---|
| 4,914,318 A | * | 4/1990 | Allen ....................... 307/272.2 |
| 5,053,652 A | * | 10/1991 | Sato et al. .................. 307/530 |
| 5,635,877 A | | 6/1997 | Monk et al. .................. 331/57 |
| 5,677,650 A | * | 10/1997 | Kwasniewski et al. ....... 331/57 |
| 5,731,734 A | | 3/1998 | Pathak et al. ................ 327/525 |
| 6,025,756 A | * | 2/2000 | Miyabe ........................ 331/57 |

OTHER PUBLICATIONS

Kumar, V. "Digital Technology Principles And Practice" *John Wiley & Sons* 1995 pp. 626–629.*
PCT International Search Report dated Oct. 16, 2001 from corresponding PCT Application No. PCT/US00/42762 filed Dec. 12, 2000.

* cited by examiner

*Primary Examiner*—David C. Mis
(74) *Attorney, Agent, or Firm*—Christie, Parker & Hale, LLP

(57) ABSTRACT

An oscillator having multi-phase complementary outputs comprises a first plurality of single ended amplifiers connected in series to form an input and an output and a second plurality of single ended amplifiers connected in series to form an input and an output. The first and second plurality have the same odd number of amplifiers, A first feedback path connects the output to the input of the first plurality of amplifiers to establish oscillations in the first plurality of amplifiers at a frequency dependent upon the delay time from the input to the output of the first plurality. A second feedback path connects the output to the input of the second plurality of amplifiers to establish oscillations in the second plurality of amplifiers at a frequency dependent upon the delay time from the input to the output of the second plurality. A first locking circuit is connected between comparable first points in the first and second plurality of amplifiers to ensure that the first points are oscillating in complementary fashion and a second locking circuit is connected between comparable second points in the first and second plurality of amplifiers to ensure that the second points are oscillating in complementary fashion.

17 Claims, 2 Drawing Sheets

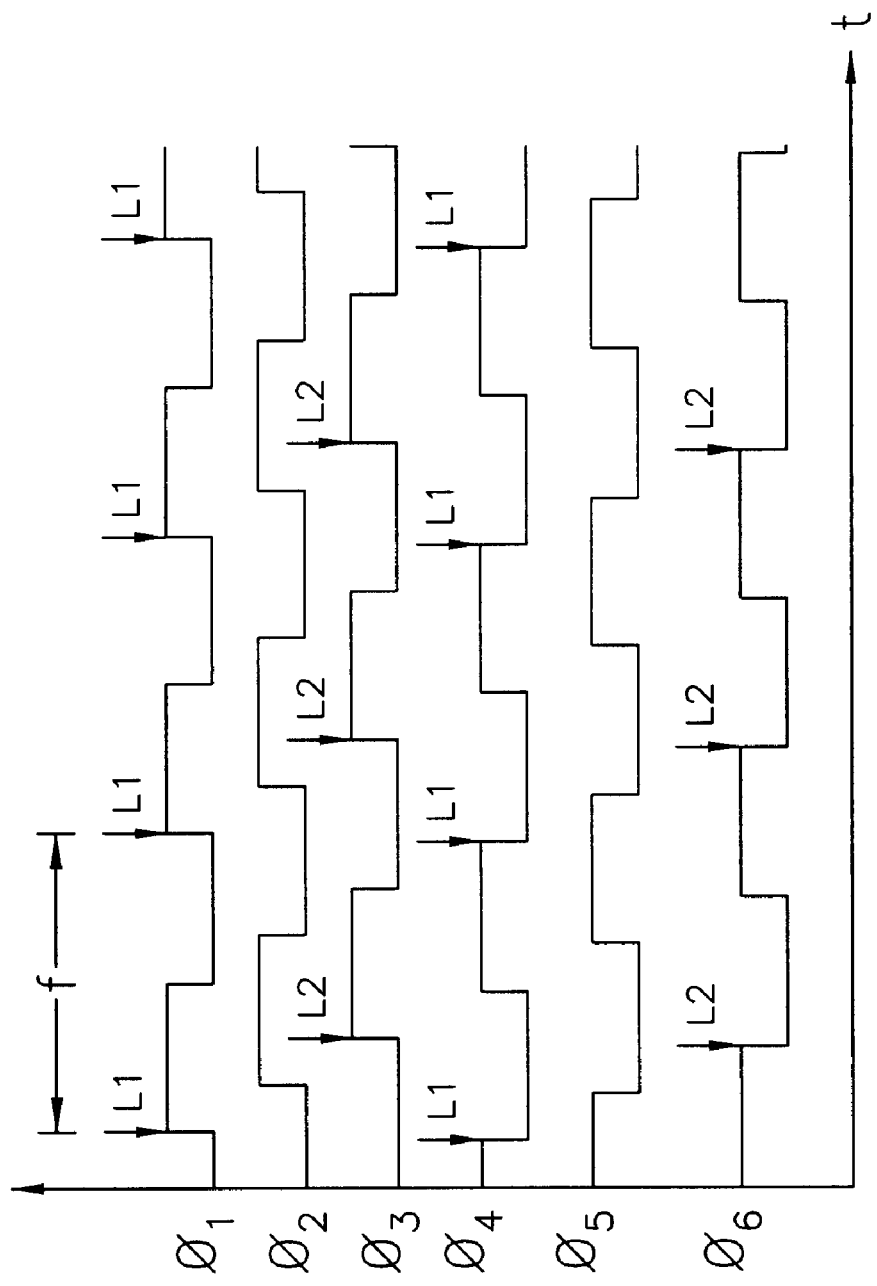

OSCILLATOR HAVING MULTI-PHASE COMPLEMENTARY OUTPUTS

CROSS-REFERENCE TO RELATED APPLICATION

This application claims the benefit of the filing date of U.S. Provisional Application No. 60/170,590, filed on Dec. 13, 1999.

BACKGROUND OF THE INVENTION

This invention relates to high frequency oscillators, and more particularly, to a high frequency oscillator having complementary multi-phase outputs.

In the data communications field, there are many applications for a multi-phase oscillator with complementary outputs. For example, a nine stage oscillator would produce at the oscillator frequency nine six multi-phase output signals phased 40, 80, 120, 160, 200, 240, 280, 320, and 360 degrees from each other. But each stage adds delay. Thus, generally the more stages there are, the slower is the oscillator and the lower is the maximum frequency of the oscillator. Complementary outputs can be generated by using differential stages or inverting single-ended outputs. However, both of these measures slow the oscillator operation and load the circuitry.

SUMMARY OF THE INVENTION

According to the invention, an oscillator having multi-phase complementary outputs comprises a first plurality of single ended amplifiers connected in series to form an input and an output and a second plurality of single ended amplifiers connected in series to form an input and an output. The first and second plurality have the same odd number of amplifiers. A first feedback path connects the output to the input of the first plurality of amplifiers to establish oscillations in the first plurality of amplifiers at a frequency dependent upon the delay time from the input to the output of the first plurality. A second feedback path connects the output to the input of the second plurality of amplifiers to establish oscillations in the second plurality of amplifiers at a frequency dependent upon the delay time from the input to the output of the second plurality. A first locking circuit is connected between comparable first points in the first and second plurality of amplifiers to ensure that the first points are oscillating in complementary fashion and a second locking circuit is connected between comparable second points in the first and second plurality of amplifiers to ensure that the second points are oscillating in complementary fashion.

BRIEF DESCRIPTION OF THE DRAWINGS

The features of specific embodiments of the best mode contemplated of carrying out the invention are illustrated in the drawings, in which:

FIG. 2 are waveforms illustrating the multi-phase complementary outputs generated by the oscillator of FIG. 1.

DETAILED DESCRIPTION OF THE EMBODIMENT

Figure 1:
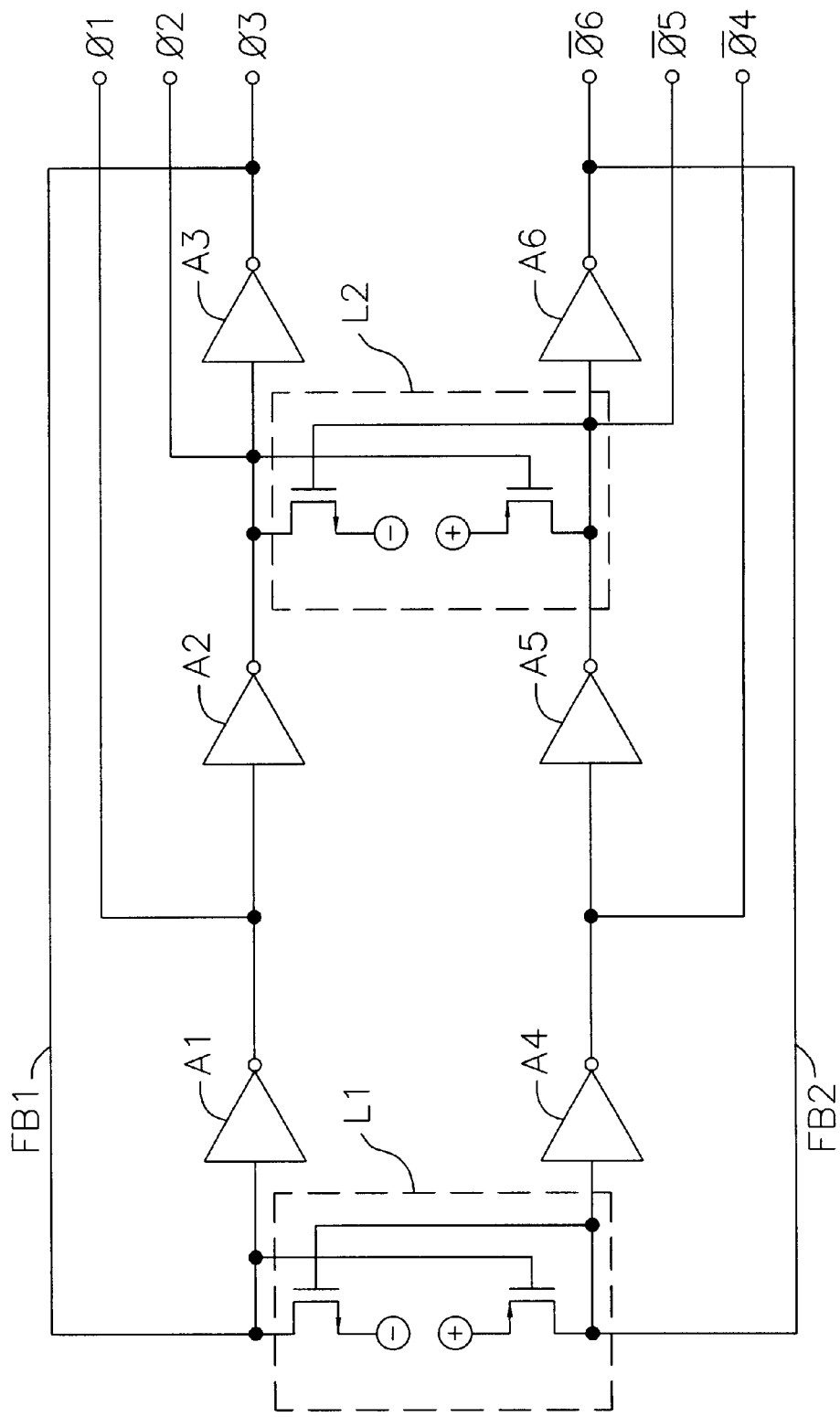
FIG. 1 is a schematic block diagram of an oscillator illustrating the principles of the invention.

In FIG. 1 a first plurality of single-ended inverting amplifiers A1, A2, A3 are connected in series in the order recited and a second plurality of single-ended inverting amplifiers A4, A5, A6 are connected in series in the order recited. A feedback path FB1 connects the output of amplifier A3 to the input of amplifier A1 to establish oscillations in amplifiers A1, A2, A3 at a frequency dependent upon the delay time from the input of amplifier Al to the output of amplifier A3. Similarly, a feedback path FB2 connects the output of amplifier A4 to the input of amplifier AG to establish oscillations in amplifiers A4, A5, A6 at a frequency dependent upon the delay time from the input of amplifier A4 to the output of amplifier A6. In summary, amplifiers A1, A2, and A3 together with feedback path FB 1 form a first ring oscillator, and amplifiers A4, A5, and A6 together with feedback path FB 2 form a second ring oscillator. Amplifiers A1, A2, and A3 are connected to output terminals ø1, ø2, and ø3, respectively, where multi-phase clock signals appear at 120 degree intervals. Similarly, amplifiers A4, A5, and AG are connected to output terminals ø4, ø5, and ø6, respectively, where multi-phase clock signals also appear at 120 degree intervals.

A locking circuit L1 is connected between one point or the first ring oscillator, namely the input of amplifier A1 and the comparable point of the second ring oscillator, namely the input of amplifier A2. Similarly, a locking circuit L2 is connected between one point of the second ring oscillator, namely the input of amplifier A3 and the comparable point of the second ring oscillator, namely the input of amplifier A6. Optionally, another locking circuit could be connected between the inputs of amplifiers A2 and AS or locking circuit L1 could be connected between amplifiers A2 and AS instead of between A3 and A6. Locking circuits L1 and L2 each preferably comprise a pair of complementary cross-coupled CMOS transistors. For example, as shown in FIG. 1, the drain of an n-type transistor is connected to the input of amplifier A1, its source is connected to a supply of negative bias potential, and its gate is connected to the input of amplifier A4. Similarly, the drain of a p-type transistor is connected to the input of amplifier A4, its source is connected to a supply of positive bias potential, and its gate is connected to the input of amplifier A1. Since the complementary transistors are cross-coupled, the inputs to amplifiers A1 and A4 are forced into complementary states.

Locking circuit L1 operates on amplifiers A1 and A4 as follows: when the signal at the input of amplifier A1 drops, the p-type transistor starts to conduct, which applies a positive potential to the gate of the n-type transistor. As a result, the n-type transistor starts to conduct, which applies a negative potential to the gate of the p-type transistor. Similarly, when the signal at the input of amplifier A4 rises, the n-type transistor starts to conduct, which applies a negative potential to the gate of the p-type transistor. As a result, the p-type transistor starts to conduct, which applies a positive potential to the gate of the n-type transistor. Thus, whichever occurs first, the input of amplifier A1 dropping or the input to amplifier A4 rising, triggers both of the complementary transistors into conduction to apply simultaneously the negative potential to the input to amplifier A1 and the positive potential to the input to amplifier A4.

When the signal at the input of amplifier A1 rises, the p-type transistor cuts off, which removes the positive potential at the gate of the n-type transistor. Similarly, when the signal at the input of amplifier A4 drops, the n-type transistor cuts off, which removes the negative potential at the gate of the p-type transistor. Each transistor cuts off only in response to the potential at its gate; they are not cut off simultaneously through cross coupling.

Locking circuit L2 operates the same way on amplifiers A3 and A6.

In summary, locking circuits L1 and L2 synchronize the operation of the first and second ring oscillators in frequency and phase each time the signal at the input of amplifier A1 or A3 drops or the signal at the input of amplifier A4 or A6 rises such that the multi-phase outputs of the second ring oscillator are complementary to the multi-phase outputs of the first ring oscillator, i.e., that the clock signals appearing at output terminals ø4, ø5, and ø6 are complementary to the clock signals appearing at output terminals ø1, ø2, and ø3, respectively.

As shown, both transistors stages of locking circuit $L_1$ turn on and off at the same time. The same is true for locking circuit $L_2$.

The relationship between the multi-phase outputs of the first and second ring oscillators is illustrated in FIG. 2, in which the vertical axis designates the clock signals at the output terminals and the horizontal axis designates elapsed time. Note that the frequency f of the clock signals is the same, the phase interval between the clock signals at output terminals ø1, ø2, and ø3 is 120 degrees, the phase interval between the clock signals at output terminals ø4, ø5, and ø6 is 120 degrees, and the clock signals at output terminals ø1, ø2, and ø3 are complementary to the clock signals at output terminals ø4, ø5, and ø6. Note also the arrows marked "L1", which represents the action of locking circuit L1 forcing amplifiers A1 and A4 into complementary relationship and the arrows marked "L2", which represents the action of locking circuit L2 forcing amplifiers A3 and A6 into complementary relationship.

The described embodiment of the invention is only considered to be preferred and illustrative of the inventive concept; the scope of the invention is not to be restricted to such embodiment. Various and numerous other arrangements may be devised by one skilled in the art without departing from the spirit and scope of this invention. For example, more or fewer amplifiers could be used in each ring oscillator, depending on the number of phases required for the application at hand. If inverting amplifiers are employed, however, an odd number of amplifiers is preferred to provide a phase inversion from output to input of the ring oscillator without a separate inverter stage. If speed is a consideration, the number of amplifiers should be minimized, preferably three in number, unless more phases are required.

What is claimed is:

1. An oscillator having multi-phase complementary outputs, the oscillator comprising:
    a first plurality of single ended bistable amplifiers connected in series to form an input and an output, the first plurality being an odd number;
    a first feedback path from the output to the input of the first plurality of amplifiers to establish bistable oscillations in the first plurality of amplifiers at a frequency dependent upon the delay time from the input to the output of the first plurality;
    a second plurality of single ended bistable amplifiers connected in series to form an input and an output, the second plurality being equal to the first plurality;
    a second feedback path from the output to the input of the second plurality of amplifiers to establish bistable oscillations in the second plurality of amplifiers at a frequency dependent upon the delay time from the input to the output of the second plurality;
    a first bias supply of one polarity;
    a second bias supply of the other polarity;
    a first latch comprising complementary transistor stages powered by the first and second bias supplies, respectively;
    means for cross-coupling the complementary transistor stages of the first latch to comparable first points in the first and second plurality of amplifiers such that the transistor stages of the first latch turn on and off at the same time to ensure that the first points are oscillating in complementary fashion; and
    a second latch comprising complementary transistor stages powered by the first and second bias supplies, respectively;
    means for cross-coupling the complementary transistor stages of the second latch to comparable second points in the first and second plurality of amplifiers such that the transistor stages of the second latch turn on and off at the same time to ensure that the second points are oscillating in complementary fashion.

2. The oscillator of claim 1, in which the first and second plurality are both three in number.

3. The oscillator of claim 2, in which the first plurality comprises first, second, and third bistable amplifiers in series in the order recited, the second plurality comprises fourth, fifth, and sixth bistable amplifiers in the order recited, the first latch is connected between the inputs of the first and fourth amplifiers, and the second latch is connected between the inputs of the third and sixth amplifiers.

4. The oscillator of claim 3, in which the complementary transistor stages of the first latch comprise first and second transistor stages that each have a source, a drain, and a gate, the means for cross-coupling the first and second transistor stages comprises a connection between the gate of the first transistor stage and the first point of the second plurality of amplifiers, a connection between the gate of the second transistor stage and the first point of the first plurality of amplifiers, a connection between the drain of the first transistor stage and the first point of the second plurality of amplifiers, and a connection between the drain of the second transistor stage and the first point of the first plurality of amplifiers, the first bias supply is connected to the source of the first transistor stage, and the second bias supply is connected to the source of the second transistor stage.

5. The oscillator of claim 4, in which the complementary transistor stages of the second latch comprise third and fourth transistor stages that each have a source, a drain, and a gate, the means for cross-coupling the third and fourth transistor stages comprises a connection between the gate of the third transistor stage and the second point of the second plurality of amplifiers, a connection between the gate of the fourth transistor stage and the second point of the first plurality of amplifiers, a connection between the drain of the third transistor stage and the second point of the second plurality of amplifiers, and a connection between the drain of the fourth transistor stage and the second point of the first plurality of amplifiers, the first bias supply is connected to the source of the third transistor stage, and the second bias supply is connected to the source of the fourth transistor stage.

6. An oscillator having multi-phase complementary outputs with a nominal cycle, the oscillator comprising:
    a first ring oscillator having a plurality of single ended stages for generating a plurality of multi-phase clock signals with the nominal cycle;
    a second ring oscillator having a plurality of single ended stages equal in number to the first oscillator for generating a plurality of multi-phase clock signals;
    a first bias supply of one polarity that powers the first ring oscillator;
    a second bias supply of the other polarity that powers the second ring oscillator;

means for synchronizing the operation of the first and second ring oscillators so they operate at the same frequency and the stages of the second ring oscillator have outputs that are complementary to the corresponding stages of the first ring oscillator, the synchronizing means comprising complementary transistor stages powered by the first and second bias supplies, respectively and cross connected between the ring oscillators to turn on at the same time during part of a cycle.

7. A method for generating multi-phase complementary outputs having a given nominal cycle, the method comprising the steps of:

connecting in tandem a plurality of single ended amplifier stages to form a first ring oscillator that generates a plurality of multi-phase clock signals having the given cycle;

connecting in tandem a plurality of single ended amplifier stages equal in number to the first ring oscillator to form a second ring oscillator that generates a plurality of multi-phase clock signals that are complementary to the corresponding stages of the first ring oscillator;

applying power of one polarity to one point in the first ring oscillator during part of each cycle; and applying power of the other polarity to the one point in the second ring oscillator during the same part of each cycle to synchronize the operation of the ring oscillators.

8. The method of claim 7, in which the step of applying power to the second ring oscillator applies power at the same time as power is applied to the first ring oscillator.

9. An oscillator having multi-phase complementary outputs, the oscillator comprising:

a first plurality of single ended invertors connected in series to form an input and an output, the first plurality being an odd number;

a first feedback path from the output to the input of the first plurality of invertors to establish bistable oscillations in the first plurality of invertors at a frequency dependent upon the delay time from the input to the output of the first plurality;

a second plurality of single ended invertors connected in series to form an input and an output, the second plurality being equal to the first plurality;

a second feedback path from the output to the input of the second plurality of invertors to establish bistable oscillations in the second plurality of invertors at a frequency dependent upon the delay time from the input to the output of the second plurality;

a first power supply of one polarity;

a second power supply of the other polarity;

a first latch comprising complementary transistor stages powered by the first and second power supplies, respectively;

means for cross-coupling the complementary transistor stages of the first latch to comparable first points in the first and second plurality of invertors such that the transistor stages of the first latch turn on and off at the same time to ensure that the first points are oscillating in complementary fashion;

a second latch comprising complementary transistor stages powered by the first and second power supplies, respectively; and means for cross-coupling the complementary transistor stages of the second latch to comparable second points in the first and second plurality of invertors such that the transistor stages of the second latch turn on and off at the same time to ensure that the second points are oscillating in complementary fashion.

10. The oscillator of claim 9, in which the first and second plurality are both three in number.

11. The oscillator of claim 10, in which the first plurality comprises first, second, and third bistable invertors in series in the order recited, the second plurality comprises fourth, fifth, and sixth bistable invertors in the order recited, the first latch is connected between the inputs of the first and fourth invertors, and the second latch is connected between the inputs of the third and sixth invertors.

12. The oscillator of claim 11, in which the complementary transistor stages of the first latch comprise first and second transistor stages that each have a source, a drain, and a gate, the means for cross-coupling the first and second transistor stages comprises a connection between the gate of the first transistor stage and the first point of the second plurality of invertors, a connection between the gate of the second transistor stage and the first point of the first plurality of invertors, a connection between the drain of the first transistor stage and the first point of the second plurality of invertors, and a connection between the drain of the second transistor stage and the first point of the first plurality of invertors, the first power supply is connected to the source of the first transistor stage, and the second power supply is connected to the source of the second transistor stage.

13. The oscillator of claim 12, in which the complementary transistor stages of the second latch comprise third and fourth transistor stages that each have a source, a drain, and a gate, the means for cross-coupling the third and fourth transistor stages comprises a connection between the gate of the third transistor stage and the second point of the second plurality of invertors, a connection between the gate of the fourth transistor stage and the second point of the first plurality of invertors, a connection between the drain of the third transistor stage and the second point of the second plurality of invertors, and a connection between the drain of the fourth transistor stage and the second point of the first plurality of invertors, the first power supply is connected to the source of the third transistor stage, and the second power supply is connected to the source of the fourth transistor stage.

14. An oscillator having multi-phase complementary outputs with a nominal frequency, the oscillator comprising:

a first ring oscillator having a plurality of single ended stages for generating a plurality of multi-phase clock signals with the nominal frequency;

a second ring oscillator having a plurality of single ended stages equal in number to the first oscillator for generating a plurality of multi-phase clock signals;

a first power supply of one polarity that powers the first ring oscillator;

a second power supply of the other polarity that powers the second ring oscillator; and means for synchronizing the operation of the first and second ring oscillators so they operate at the same frequency and the stages of the second ring oscillator have outputs that are complementary to the corresponding stages of the first ring oscillator, the synchronizing means comprising complementary transistor stages powered by the first and second power supplies, respectively and cross connected between the ring oscillators to turn on at the same time.

15. A method for generating multi-phase complementary outputs having a given nominal frequency, the method comprising the steps of:

connecting in tandem a plurality of single ended invertor stages to form a first ring oscillator that generates a plurality of multi-phase clock signals having the given frequency, the first ring oscillator having a first point of application;

connecting in tandem a plurality of single ended invertor stages equal in number to the first ring oscillator to form a second ring oscillator that generates a plurality of multi-phase clock signals that are complementary to the corresponding stages of the first ring oscillator; the second ring oscillator having a second point of application;

applying power of one polarity to the first point in the first ring oscillator during part of each clock signal; and applying power of the other polarity to the second point in the second ring oscillator during the same part of each clock signal to synchronize the operation of the ring oscillators.

16. The method of claim 15, in which the step of applying power to the second ring oscillator applies power at the same time as power is applied to the first ring oscillator.

17. An oscillator having multi-phase complementary outputs, the oscillator comprising:

a first odd number of inverters connected in series to form a first forward path from an input to an output, the inverters in the first forward path being biased to operate between a positive voltage and ground;

a second odd number of inverters connected in series to form a second forward path from an input to an output, the inverters in the second forward path being biased to operate between a negative voltage and ground;

the number of inverters in the first and second forward paths being equal;

a first feedback path from the output to the input of the first forward path to establish oscillations at a frequency dependent upon the delay time from the input to the output of the first forward path;

a second feedback path from the output to the input of the second forward path to establish oscillations at a frequency dependent upon the delay time from the input to the output of the first path;

a first power supply of one polarity;

a second power supply of the other polarity;

a first latch comprising complementary transistor stages biased by the first and second bias supplies, respectively;

means for cross-coupling the complementary transistor states of the first locking circuit to comparable first points in the first and second forward paths such that the transistor stages of the first locking circuit turn on and off at the same time to ensure that the first points are oscillating in complementary fashion; and a second latch comprising complementary transistor stages powered by the first and second bias supplies, respectively;

means for cross-coupling the complementary transistor states of the second locking circuit to comparable second points in the first and second forward paths such that the transistor stages of the second locking circuit turn on and off at the same time to ensure that the second points are oscillating in complementary fashion.

* * * * *